(12) United States Patent
Munday et al.

(10) Patent No.: US 6,895,224 B1
(45) Date of Patent: May 17, 2005

(54) ELECTROMAGNETIC WAVE RECEIVER FRONT END

(75) Inventors: Paul D. Munday, Malvern (GB); Andrew R. Barnes, Malvern (GB); Geoffrey Ball, Malvern (GB); Mark T. Moore, Wigston (GB); Alexander L. Brown, North Finchley (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 09/936,561
(22) PCT Filed: Mar. 15, 2000
(86) PCT No.: PCT/GB00/00953
§ 371 (c)(1), (2), (4) Date: Feb. 27, 2002
(87) PCT Pub. No.: WO00/55965
PCT Pub. Date: Sep. 21, 2000

(30) Foreign Application Priority Data

Mar. 17, 1999 (GB) .............................. 9906047

(51) Int. Cl.$^7$ ................................. H04B 1/38
(52) U.S. Cl. .................... 455/73; 455/78; 455/82; 455/3.02
(58) Field of Search ................. 455/73, 78, 82, 455/83, 3.02, 80, 88, 194, 216, 412.2, 226.3, 226.1, 200.1, 232.1, 323, 341, 334; 342/118, 372; 375/150; 333/219

(56) References Cited

U.S. PATENT DOCUMENTS

| | | | | |
|---|---|---|---|---|
| 4,275,362 A | * | 6/1981 | Harford | 330/283 |
| 4,489,292 A | * | 12/1984 | Ogawa | 333/202 |
| 5,093,667 A | | 3/1992 | Andricos | |

(Continued)

FOREIGN PATENT DOCUMENTS

| | | |
|---|---|---|
| EP | 0 348 370 A2 | 12/1989 |
| EP | 0 495 598 A1 | 1/1992 |
| EP | 0 535 780 A1 | 6/1992 |
| EP | 0 769 847 A1 | 10/1996 |
| EP | 0 752 756 A2 | 1/1997 |

OTHER PUBLICATIONS

Miteq Inc: "MM–Wave Block Converters" Microwave Journal, US, Horizon House , Dedham vol. 39, No. 07. 01 Jul. 1, 1996 p. 144, 146, 148, 15 XP000679084 ISSN: 0192–6225 p. 150, middle col.; Figure 5.

Wenger J. et al: "KA and V–Band MMIC Components for Personal Communication Networks" IEEE Mitt–S International Microwave Symposium Digest, US, New York, IEEE, 1996 pp. 491–494, XP 000731925 ISBN: 0–7803 3247–4 p. 492, right–hand col.

Maas S. A. et al: "A Broadband, Planar, Doubly Balanced Monolighic KA–Band Diode Mixer" IEEE Transactions on Microwave Theory and Techniquest , US, IEEE Inc. New York. vol. 41, No. 12, Dec. 1, 1993 pp. 2330–2335, XP000426152 ISSN 0018–9480 Abstract.

(Continued)

*Primary Examiner*—Edward F. Urban
*Assistant Examiner*—Lana Le
(74) *Attorney, Agent, or Firm*—Nixon & Vanderhye P.C.

(57) ABSTRACT

A receiver front end is provided capable of receiving electromagnetic wave signals having frequencies in the range of substantially 35 GHz to substantially 40 GHz, and having a gain of substantially 24 dB or above and a noise figure of substantially 4 dB or below, and comprising one or more multifunction monolithic microwave integrated circuits (MMICs). The receiver front end preferably has a noise figure of substantially 4 dB or below over an output signal frequency range of substantially 1 to 10 GHz, and a size in the region of 30 mm$^2$ or less. The reveiver front end may comprise a receiver MMIC, and a doubler/buffer amplifier MMIC. The receiver MMIC may comprise a low noise amplifier (3), a mixer (5), a filter (4) and an intermediate frequency amplifier (6).

10 Claims, 10 Drawing Sheets

U.S. PATENT DOCUMENTS

| | | | | |
|---|---|---|---|---|
| 5,239,685 A | * | 8/1993 | Moe et al. | 455/73 |
| 5,241,291 A | * | 8/1993 | Blackburn | 333/219 |
| 5,428,839 A | | 6/1995 | Friesen et al. | |
| 5,471,220 A | * | 11/1995 | Hammers et al. | 342/372 |
| 5,649,312 A | | 7/1997 | Kennan | |
| 5,852,389 A | * | 12/1998 | Kumar et al. | 332/103 |
| 6,052,559 A | * | 4/2000 | Buer et al. | 455/12.1 |
| 6,151,491 A | * | 11/2000 | Farris et al. | 455/412.2 |
| 6,442,374 B1 | * | 8/2002 | Brady et al. | 455/73 |
| 6,724,811 B2 | * | 4/2004 | Kohli et al. | 375/150 |
| 6,812,824 B1 | * | 11/2004 | Goldinger et al. | 342/118 |
| 2002/0025786 A1 | * | 2/2002 | Brady et al. | 455/78 |
| 2004/0203337 A1 | * | 10/2004 | Ammar et al. | 455/3.02 |

OTHER PUBLICATIONS

Mondal J. et al: "KA Bank MMIC Receiver with Ion–Implanted Technology for High–Volume and Low–Cost Application" IEEE Microwave and Guided Wave Letters, US, IEEE Inc. New York, vol. 1, No. 10, Oct. 1, 1991 pp. 278–281, XP 000227277 ISSN: 1051–8207 Abstract.

Dieudonne J. M. et al "GAAS MESFET Technology Based MMICS for Millimetre–Wave Front–Ends" European Microwave Conference Proceedings, G.B. Nexus Business Communications vol. Conf. 24, 1994, pp. 534–541, XP 000643208 ISBN: 0–9518–0325–56 p. 535 paragraph 5 p. 536 paragraph 2.

Kato H. et al. "A 30–GHZ–Band Full–MMIC Receiver for Satellite Transponders" International Microwave Symposium, US, New York, IEEE, 1998 p. 564–568 , XP00024768 ISSN: 0149–645X p. 566 right–hand col.

* cited by examiner

United States Patent US 6,895,224 B1

ELECTROMAGNETIC WAVE RECEIVER FRONT END

This application is the US national phase of international application PCT/GB00/00953, filed in English on 15 Mar. 2000, which designated the US PCT/GB00/00953 claims priority to GB Application No. 9906047.7 filed 17 Mar. 1999. The entire contents of these applications are incorporated herein by reference.

FIELD OF THE INVENTION

This invention relates to improvements in electromagnetic wave receiver front ends capable of receiving waves having frequencies in the radio frequency range, and the components used therefor.

BACKGROUND OF THE INVENTION

In recent years there has been a tremendous growth in the number of applications where it is desirable to be able to receive electromagnetic waves having frequencies in the radio frequency range, and particularly in the range of ten's of gigahertz (i.e. having wavelengths of millimeters, called mm-wave frequencies). Such applications include local multipoint distribution systems (LMDS), microwave video on demand systems (MVDS), collision avoidance radar, wireless local area networks (WLANs) and others. This trend is further driven by increasing frequency spectrum congestion at lower (microwave) frequencies, and the desire to have global communications with ever increasing data rates. For mm-wavelength receiver technology to be successful in the market place, it is important that acceptable performance is achieved while, at the same time, component size and cost is minimised. This is so for all components of such receivers including receiver front end components which generally receive electromagnetic wave signals from, for example, an antenna and process these signals before passing them to further receiver components.

SUMMARY OF THE INVENTION

According to a first aspect of the present invention, there is provided a receiver front end capable of receiving electromagnetic wave signals having frequencies in the range of substantially 35 GHz to substantially 40 GHz, and having a gain of substantially 24 dB or above and a noise figure of substantially 4 dB or below, and comprising one or more multifunction monolithic microwave integrated circuits (MMICs).

The receiver front end preferably has a noise figure of substantially 4 dB or below. This is preferably over an output signal frequency range of substantially 1 to 10 GHz, and preferably at least over substantially 2 to substantially 8 GHz. Prior art receivers based on similar technology typically have noise figures of greater than or equal to 6 dB at such frequencies i.e. mm-wave frequencies.

The receiver front end preferably has a size in the region of 30 mm$^2$, or less than this for example 28 mm$^2$ or 25 mm$^2$. The small size of the receiver front end is particularly useful for applications where a multiple of receiver front ends are required to be placed close together in a small space.

The or each receiver front end MMIC may have a GaAs substrate. MMICs are a key enabling technology for mm-wavelength receivers due to their small size, improved reliability, high repeatability and the potential for low cost. Multifunction MMICs, integrating several functions onto a single MMIC, are particularly attractive since they allow further size, weight and reliability improvements arising from the use of fewer MMICs. The low cost and low parts count of multifunction MMICs makes the receiver front ends incorporating such MMICs easily replaceable if they fail.

The or each multifunction receiver front end MMIC may carry out a plurality of functions or two or more functions, or three or more functions, or preferably at least four functions. These functions may comprise amplification of the electromagnetic wave signals received by the MMIC, and/or filtering the electromagnetic wave signals, and/or conversion of the frequency or frequencies of the electromagnetic wave signals to a lower or higher frequency or frequencies, and/or amplification of the converted signals.

When multiple single function MMICs are used in a receiver front end, connections, such as tape bonds, bond wires or flip MMIC connections, need to be provided between these. At each connection there is the possibility of the introduction of interface parasitics into the signal, and such connections tend to filter high frequency (i.e. ten's of gigahertz) signals which is undesirable. In addition, the connections have to be very short to be usable in practice. By using one or more multifunction MMICs the number of MMICs required in an equivalent receiver front end is reduced, thereby reducing the number of connections required and the possibility of parasitics etc. In addition, when multiple of single function MMICs are used in a receiver front end, these may be manufactured from more than one semiconductor wafer and by more than one semiconductor manufacturing process. This may introduce differences in the operation of the MMICs due to differences in the semiconductor wafers or processing. When multifunction MMICs are used all of the functions may be included on the same wafer and on the same area of the wafer. This reduces the possibility of process differences between MMICs, and produces a smaller spread in performance characteristics than with the use of multiple single function MMICs.

The receiver front end preferably comprises a receiver MMIC and preferably a doubler/buffer amplifier MMIC.

The receiver MMIC may comprise a low noise amplifier (LNA). This is preferably the first component of the receiver front end and receives the electromagnetic wave signals. These signals may be received via microstrip transmission lines, or coplanar wave guides, or grounded co-planar wave guides. The LNA may be connected to one or more microstrip lines by 50 μm gold tape bonds. The LNA preferably has a gain in the region of 24 dB or, more preferably, greater than 24 dB. The input and output port return losses are preferably greater than 12 dB, and the noise figure preferably less than 4 dB.

The LNA is preferably a balanced amplifier, and each electromagnetic signal received by the LNA is preferably split into two substantially symmetric signals, each of which is fed into a separate amplification section. The two signals preferably have a 90' phase difference. Splitting of the signal improves the linearity of the operation of the LNA. Preferably a 90° coupler receives the electromagnetic signals and splits each of these into two signals. The coupler may be a Lange coupler.

It is important to have good impedance and power matching between the input of the receiver MMIC, i.e. the input of the LNA, and any circuit connected to this input for use (such as an antenna circuit). When a difference occurs between these impedances, a portion of the electromagnetic wave signals will be reflected at the input of the receiver MMIC. The receiver MMIC is preferably designed assuming that the impedance of any circuit connected to its input for use is 50 Ω. This is a standard assumption in the design of such apparatus. The Lange coupler may comprise four ports. The first of these preferably receives the electromagnetic wave signals. The coupler splits these signals and produces two signals preferably output through the second and third ports. If imperfect impedance matching occurs at these ports some of the output signals will be reflected back through the coupler and out of the LNA. For proper operation, the Lange coupler is preferably provided with one or more resistive components, preferably on the fourth port of the coupler. These may comprise a load resistor of preferably 50 Ω. Any signal reflected at the second and third ports is dissipated in this resistor and is not reflected out of the LNA of the receiver MMIC. The Lange coupler provides some decoupling of the receiver MMIC input impedance matching from variations in the impedance of the circuit connected to the receiver MMIC input. This is particularly important at frequencies of tens of gigahertz as small variations in the impedance of connections to the receiver MMIC input, such as tape bond connections, lead to a degraded noise figure performance.

Each amplification section of the LNA may use three stages of amplification. Three stages of amplification enables a gain specification of greater than 24 dB to be met. It is important that the LNA has good gain characteristics as this minimises the effect of any noise contribution of the following components of the receiver MMIC. It is important that the noise introduced by the receiver front end and the receiver as a whole is as low as possible, as the receiver front end and the receiver are usually the first component in a chain of components and any noise introduced in the first component will be amplified by these other components.

Each stage of amplification may be provided with one or more transistors. Shunt resistors may be provided on each transistor gate. These provide low frequency stabilisation on each gate. Care is taken to ensure that the in-band noise figure is not degraded. A series resistor-inductor capacitor network is preferably provided in parallel with the path of each split signal. This helps to overcome potential high frequency stability problems. Parallel feedback is preferably used across the third stage transistor. This helps to provide gain slope compensation and unconditional stability. All bias tracks, in both amplification sections, are preferably commoned so that only single gate and drain connections are required. This provides ease of use of the LNA. The output of each amplification section is combined, preferably using a Lange coupler, and the combined signal output from the LNA.

In a preferred embodiment, over the frequency range 30 to 40 GHz the measured gain of the LNA is 23 dB±1 dB. The Lange couplers ensure that the input and output port return losses are better than 20 dB. The LNA noise figure is approximately 3.2 dB.

The receiver MMIC preferably further comprises a mixer. This preferably converts the frequency of the signal output from the LNA to a lower frequency mixer output signal. The lower frequency signal is preferably output from the receiver MMIC to further stages of the receiver MMIC or to a component to which the receiver MMIC is attached for use. The frequency of the signal from the LNA is converted to a lower frequency signal, e.g. 5 GHz (an intermediate frequency (IF)), as such signals can be more easily processed, unlike signals having frequencies greater than approximately 6 GHz. The aim is to retain as much information in the signal from the LNA as possible, whilst reducing its frequency so that it can be more easily analysed.

The mixer preferably comprises two diodes. These may be positioned in the mixer back-to-back. Non-linear analysis may be used to determine the optimum diode size for mixer operation over a 30 to 45 GHz frequency range. The signal from the LNA is preferably fed into the diodes along with a reference signal. The diodes preferably multiply the two signals, and, due to their non-linearity, output a signal having a frequency equal to the difference in frequency of the signal from the LNA and the frequency of the reference signal. If the frequency of the signal from the LNA is 35 GHz and the frequency of the reference signal is 30 GHz, then the frequency of the signal output from the mixer will be 5 GHz. The reference signal is preferably provided by a local oscillator (LO). This may have a drive level of 13 dBm.

The mixer may be a 90° balanced mixer. The reference signal from the LO and the signal from the LNA output are fed into input ports and are preferably split with a 90° phase difference preferably by a Lange coupler. One portion of each of the reference signal and the LNA signal is preferably fed to a first diode, and the other portions of these signals is preferably fed to the second diode which has its orientation reversed. Each diode preferably mixes the reference signals and the LNA signals and produces an IF output signal, which output signals are combined in phase and fed to an output port of the mixer. This 90° balanced mixer topology provides very good input and output port impedance matches, giving the mixer input ports a broadband 50 Ω impedance. In this topology, however, when the impedance matching of the diodes to the rest of the mixer is not ideal, some LNA signal may be reflected back out of the reference signal input port and some reference signal may be reflected back out of the LNA signal input port, i.e. the isolation of these ports, called LO-RF isolation, may be reduced. The mixer preferably has a conversion loss of less than 10 dB. It preferably has LNA and reference signal input port return losses of greater than 15 dB. The LO-RF isolation may be greater than 6 dB.

The above describes the situation when the signal from the LNA comprises only one frequency. This signal will more often comprise a range of frequencies. The mixer will then provide an output signal which has a range of frequencies, equal to the difference of the frequencies of the signal from the LNA and the frequency of the reference signal.

If the frequency of the reference signal is 30 GHz, and the signal from the LNA comprises frequencies of 35 GHz and 25 GHz then both of these will result in an output of the mixer of 5 GHz. The 35 GHz and the 25 GHz frequencies are referred to as upper and lower sidebands respectively. For many applications only one sideband, e.g. the upper sideband, is required to be converted by the mixer. This is called the wanted sideband. A filter can be used to filter out the unwanted sideband from the signal output from the LNA before it is fed to the mixer. The receiver is said to be capable of image rejection by suppressing a sideband, in this case the lower sideband.

The receiver MMIC preferably further comprises a filter. This is preferably placed between the LNA and the mixer, to filter the signal from the LNA before it is fed to the mixer. The passband of the filter is preferably such that it suppresses a sideband, preferably a lower sideband. The passband of the filter may be 35 to 40 GHz, frequencies lying outside this band are said to lie in the stopband of the filter. This will suppress a lower sideband of 25 GHz, allowing only the 35 GHz sideband to be output from the filter. The filter rejects the lower sideband, i.e. achieves image rejection.

The filter may comprise a distributed transmission line design. These are feasible when receiving waves of mm wavelengths, and do not require excessive MMIC area. Such a design is advantageous over lumped element filter designs at these wavelengths, which suffer from a relatively high insertion loss and are sensitive to process variations, particularly when metal-insulator-metal (MIM) capacitors are used. To reduce the receiver MMIC area the filter is preferably folded into a serpentine layout. A five element, quarter-wave coupled line filter may be used. This preferably produces a stopband attenuation of greater than 30 dB, preferably 49 dB, at 25 GHz. The passband insertion loss of this filter is preferably in the region of 2.3 dB from 35 to 40 Ghz. The input and output port impedance matches are preferably better than 15 dB.

The Lange coupler of the mixer preferably provides a 50 Ω input impedance at the passband and stopband frequencies of the filter. This is essential to ensure that suppression of the frequencies in the stopband of the image rejection filter is not compromised.

The receiver MMIC preferably further comprises an IF amplifier. This preferably receives the IF output signal from the mixer and amplifies it producing an IF output signal which is output from the receiver MMIC. The majority of the amplification of the receiver as a whole is usually performed at intermediate frequencies in the IF amplifier, since gain blocks at these frequencies are relatively inexpensive.

The IF amplifier preferably comprises a single transistor stage. It preferably has a gain of greater than 9 dB. A 400 $\mu$m gate width transistor capable of delivering 15 dBm of output power is preferably used for this amplifier. This avoids the IF amplifier compressing before the LNA. A parallel resistor-inductor-capacitor feedback network is preferably applied between the gate and drain terminals of the transistor. This helps to reduce the sensitivity of the IF amplifier to process variations. The IF amplifier input preferably presents a 50 Ω impedance to the mixer at mm wavelengths as well as at IF frequencies. This helps to ensure correct mixer operation.

The receiver MMIC is preferably constructed from the building blocks described above. It is important during the design of the receiver MMIC to maintain an overview of how the individual component designs work together both electrically and in terms of physical layout. The receiver MMIC preferably occupies an area in the region of 15 mm$^2$, or less, for example 14.5 mm$^2$.

When the receiver front end further comprises a doubler/buffer amplifier MMIC, this is preferably placed between the LO and the mixer. It preferably receives the reference signal produced by the LO, and doubles the frequency of this signal producing a new reference signal which is fed to the mixer. Such a MMIC is useful when a high frequency, e.g. 30 GHz, reference signal is to be produced. LOs capable of producing such signals are available, however they do not have the power capacity required to drive the mixer. LOs producing low frequency reference signals, e.g. 15 GHz, are readily available and are cheap. The power capacity of these may be sufficient to drive the mixer, or may be amplified by the MMIC to drive the mixer. The signals from these may be doubled using the doubler MMIC.

The doubler component of the doubler/buffer amplifier MMIC may introduce a loss into the signal fed through it. The MMIC therefore preferably comprises a buffer amplifier component to amplify the signal compensating for the loss introduced by the doubler component. The loss introduced maybe in the region of 6 dB, and the amplifier component on the MMC preferably gives a gain of approximately 18 dB. The buffer amplifier component may also amplify the signal from the LO to provide sufficient power in the MMIC output signal to drive the mixer.

The doubler/buffer amplifier MMIC preferably also comprises a filter component comprising two quarter wavelength open circuit stubs. These allow only the doubled frequency signal to be output from the MMIC, and suppress output of the signal received from the LO.

The doubler/buffer amplifier MMIC preferably gives an output power of greater than 13 dBm over the range 32 to 40 GHz from an input reference signal frequency of 16 to 20 GHz and power level of 0 dBm. The doubler/buffer amplifier MMIC preferably uses a pinched-off 4×30 $\mu$m device operating as a half wave rectifier, and is preferably matched to enhance and extract the second harmonic portion (i.e. twice the frequency) of the input reference signal from the LO. A three stage amplifier component may be used to provide 19 dB of amplification and provide 30 to 40 dB of rejection of the reference signal from the LO. The doubler/buffer amplifier MMIC layout may comprise an area in the region of 5 mm$^2$, and may comprise a GaAs substrate. The doubler/buffer amplifier MMIC may provide a reference signal having a frequency in the range 32 GHz to 40 GHz, from a LO operating at 16 GHz to 20 GHz.

Because of the good gain characteristics of the receiver front end, the receiver as a whole, to which it is attached for use, can have a gain in the region of 100 dB or more. Such gains are often required in mm-wavelength receivers to boost the low power electromagnetic wave signals received in many applications to an acceptable level.

According to a second aspect of the present invention there is provided a receiver front end package comprising a receiver front end according to the first aspect of the invention, power supply components for the receiver front end, and connectors for the receiver and the power supply components.

The receiver package is preferably double sided allowing isolation of the electromagnetic wave receiver front end and the power supply components into separate enclosures. Connections may be made between the receiver front end and the power supply components using glass bead feedthroughs in the package floor. The MIC or MMICs of the receiver front end are preferably placed on a receiver front end circuit board, which may have a 127 $\mu$m RT Duroid 5880 substrate. The MMIC or MMICs are preferably attached onto brass backing in milled pockets in the Duroid substrate.

The noise figure of the receiver front end package is preferably in the range 5.0 to 6.0 dB. The package preferably measure in the region of 40 mm×27 mm×15 mm (i.e. in the region of 9 cm$^2$) or less than this. The small size of the package is a distinct advantage over known receiver front end packages which are much more bulky and heavy. These can have a size of 10 cm×5 cm×2 cm, i.e. 100 cm$^2$, receiver front ends of the invention corresponds to approximately a factor of ten improvement over the prior art. The small size of the receiver front end packages of the invention enables their use in systems where space is limited, and/or systems which must be easily portable.

The power supply components preferably comprise DC biasing circuits on a circuit board. These preferably contain bias sequencing and voltage regulation for all of the bias lines of the receiver front end. This allows easier implementation of the receiver front end package as all bias voltages can be derived from only two DC supplies. A sequencing circuit is preferably included to prohibit connection of the drain supplies for the receiver front end until the gate supplies have been established. The DC circuit board are preferably implemented on 250 µm. Alumina using standard thin film circuit techniques.

The connectors of the receiver front end package are preferably co-axial connectors. These may be co-axial Anritsu K-connectors. They may be connected to the receiver front end using an airline launch technique. The technique preferably allows easy insertion and removal of the receiver front end circuit board, and preferably provides a better than 20 dB impedance match of the connectors with the receiver front end. The receiver front end circuit board is preferably connected to the coaxial connectors by 250 µm gold tape bonds. These are preferably kept as short as possible to minimise any parasitic inductance and maintain a good impedance match. Commercially available receiver packages commonly use waveguide connectors, which can be bulky and heavy.

The receiver front end package preferably exhibits a conversion gain in the region of or greater than 24 dB, image rejection in the region of or greater than 40 dB and a noise figure in the region of or less than 5.5 dB.

The receiver front end package may be connected to an antenna, which detects the electromagnetic waves. The antenna may be movable through a substantial angle, for example the antenna may be used in a telecoms link or a sweeping radar system. Conventional receiver front ends connected to such antennas have to be able to transmit high frequency signals through a movable joint which is difficult to achieve. The receiver front end package of the invention, because of its small size, can be mounted on the antenna or a movable component thereof and can move with the antenna. The receiver front end will convert the high frequency electromagnetic waves received by the antenna to an IF output signal. This signal is fed to subsequent components via the movable joint, but because of its decreased frequency, realisation of the movable joint is much easier.

According to a third aspect of the present invention there is provided a phased array system comprising a plurality of receiver front ends according to the first aspect of the invention.

The phased array system may be an emitter system or a detector system. Using receiver front ends of the invention has a particular advantage in this application due to their small size in comparison to conventional receiver front ends. In phased array systems it is necessary to place the receiver front ends in closely spaced channels. The spacing of the channels is limited to half the wavelength of the signal to be detected. For example, when detecting a signal having a frequency of 30 GHz (i.e. a wavelength of 10 mm) the spacing of the channels is limited to 5 mm. The small size of the receiver front end of the invention allows them to be used in phased array systems for detecting such signals. The receiver front ends also have reduced weight. Using multifunction MMICs in the receiver front ends also reduces detrimental effects which would be present due to parasitics from connections between single function chips. This gives tight tolerances on the phase performance of the MMICs, which is particularly advantageous to the operation of phased array systems.

According to a fourth aspect of the present invention there is provided a high data rate communications system comprising one or more receiver front ends according to the first aspect of the invention.

BRIEF DESCRIPTION OF THE DRAWINGS

The invention will now be further described by way of example only, with reference to the accompanying drawings, in which.

DETAILED DESCRIPTION OF THE DRAWINGS

Figure 1:
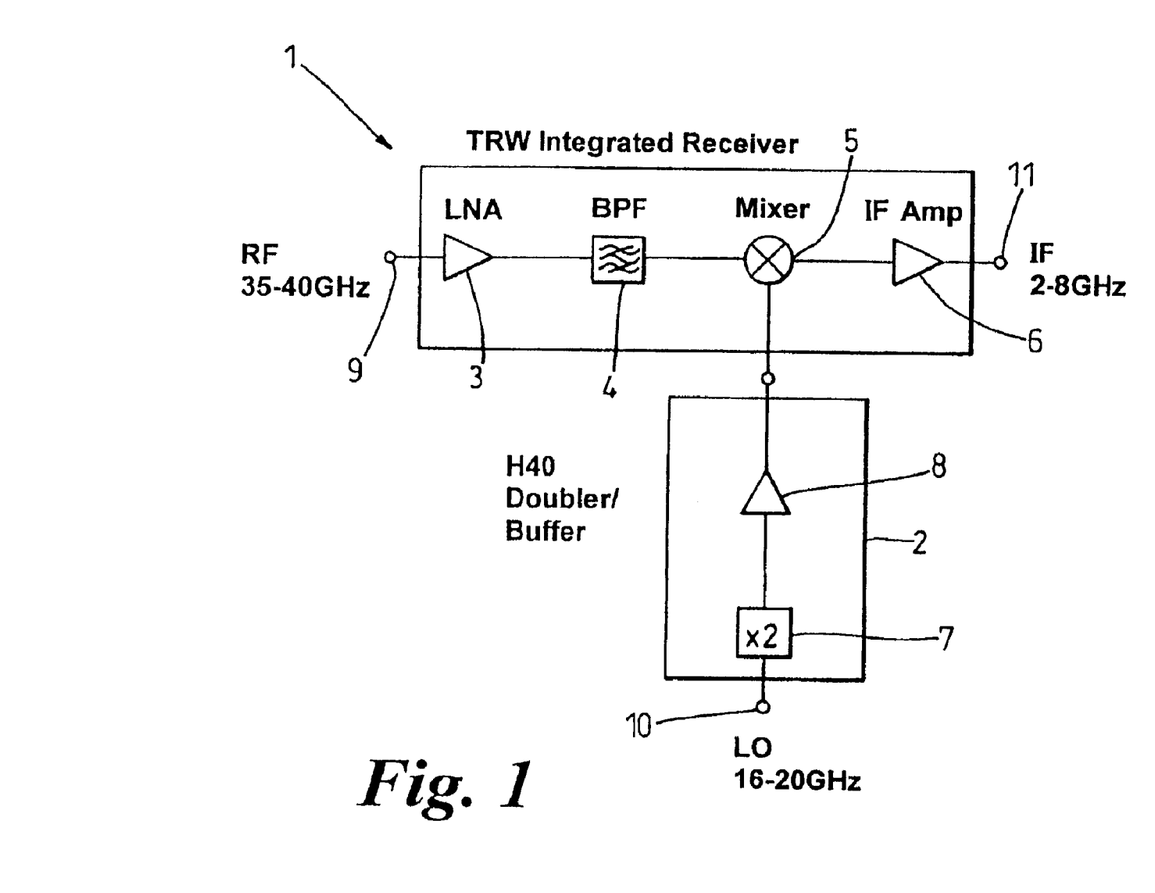
FIG. 1 is a schematic representation of a receiver front end according to the first aspect of the invention.

A simplified schematic representation of an electromagnetic wave receiver front end architecture is shown in FIG. 1. This comprises a multifunction receiver MMIC 1 and a multifunction doubler/buffer amplifier MMIC 2. The receiver MMIC comprises a low noise amplifier (LNA) 3, a filter 4, a mixer 5, and an intermediate frequency (IF) amplifier 6. The doubler/buffer amplifier MMIC comprises a doubler 7 and an amplifier 8. The electromagnetic wave signal to be detected is fed into the input 9 of the receiver MMIC and from there to the LNA. The output of the LNA is fed through the filter to the mixer. The doubler/buffer amplifier MMIC has an input 10 into which is fed a reference signal from a local oscillator (not shown). The reference signal is fed to the doubler 7, and the output of the doubler fed to the amplifier 8. The output signal of the amplifier is fed to the mixer. This signal and that from the filter are mixed in the mixer, resulting in an IF output signal from the mixer having the characteristics of the detected signal but lower frequency. This IF signal is fed to the IF amplifier 6, and the output of this is fed to the output 11 of the receiver MMIC. All RF design work of the MMICs was performed using Libra IV (Registered Trade Mark) and design layouts were undertaken on Wavemaker (Registered Trade Mark). Electromagnetic simulation of selected parts of the MMICs, using Sonnet EM (Registered Trade Mark), was carried out to analyse the effects of unwanted coupling at the frequencies of the input signals. The components of the two MMICs will now be described in more detail.

Figure 2:
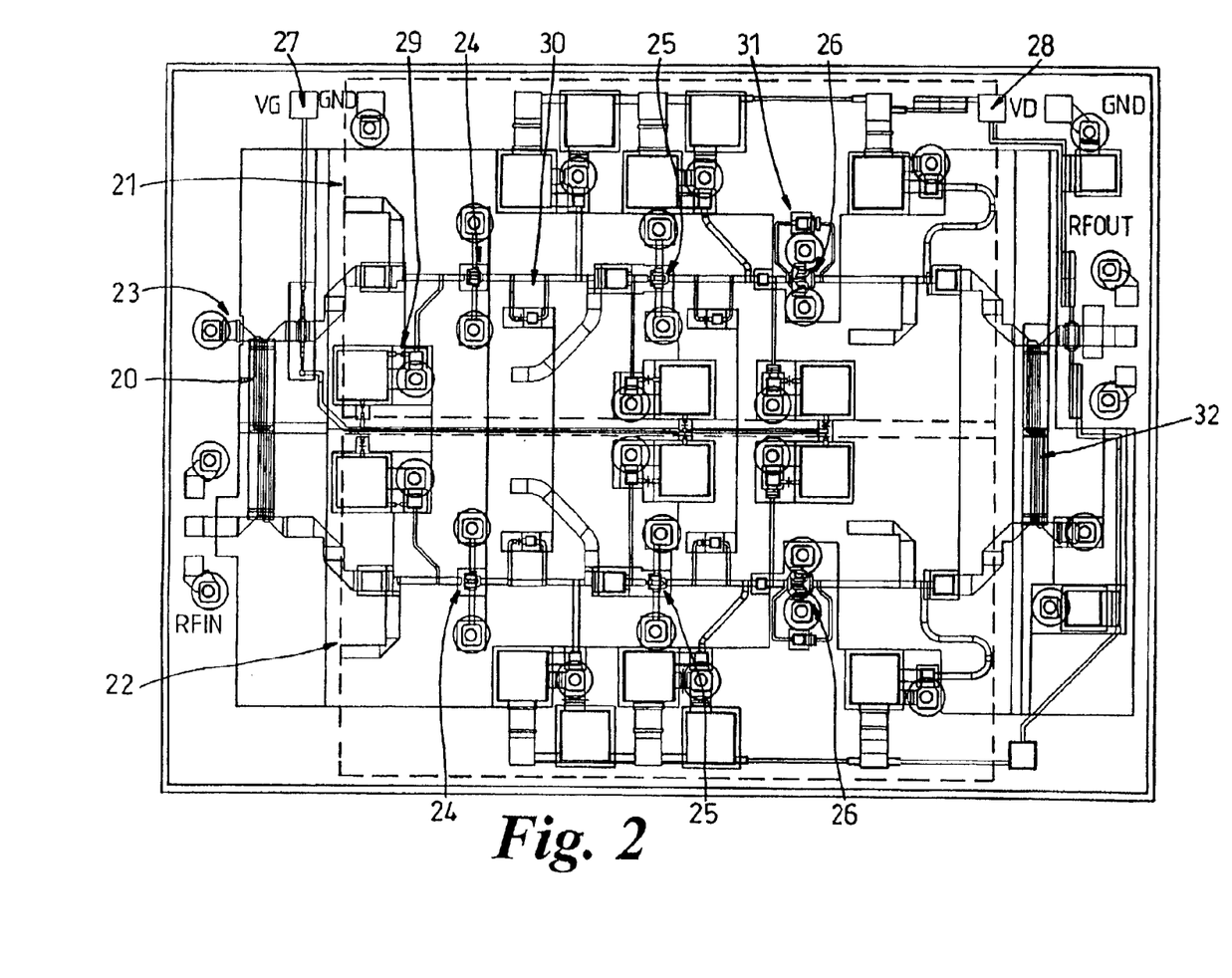
FIG. 2 shows the layout of the low noise amplifier of FIG. 1.

The layout of the LNA is shown FIG. 2. This comprises the front end of the receiver MMIC and receives the electromagnetic wave signals via microstrip transmission lines (not shown). Each electromagnetic signal received by the LNA is split into two substantially symmetric signals, by a Lange coupler 20. Each of the split signals is fed into a separate amplification section 21,22 of the LNA. The two signals have a 90° phase difference. The Lange coupler is provided with a load resistor 23 of 50 Ω. Any signal reflected from the output ports of the Lange coupler due to impedance mismatch is dissipated into this resistor and is not reflected out of the LNA.

Each amplification section of the LNA uses three stages of amplification, in a balanced topology. Each stage of amplification is provided with transistors 24,25,26. The transistors are supplied by a gate bias 27 and a drain bias 28. All bias tracks, in both amplification sections, are commoned so that only single gate and drain bias connections are required. This provides ease of use of the LNA. Shunt resistors 29 are provided on each transistor gate. These provide low frequency stabilisation on each gate. A series resistor-inductor capacitor network 30 is provided in parallel with the path of each split signal. This helps to overcome potential high frequency stability problems. Parallel feedback 31 is used across the third stage transistor 26. This helps to provide gain slope compensation and unconditional stability. The output of each amplification section is combined, using a Lange coupler 32, and the combined signal output from the LNA.

Over the frequency range 30 to 40 GHz the measured gain of the LNA is 23 dB±1 dB. The Lange couplers ensure that the input and output port return losses are better than 20 dB. The noise figure is approximately 3.2 dB.

Figure 3:
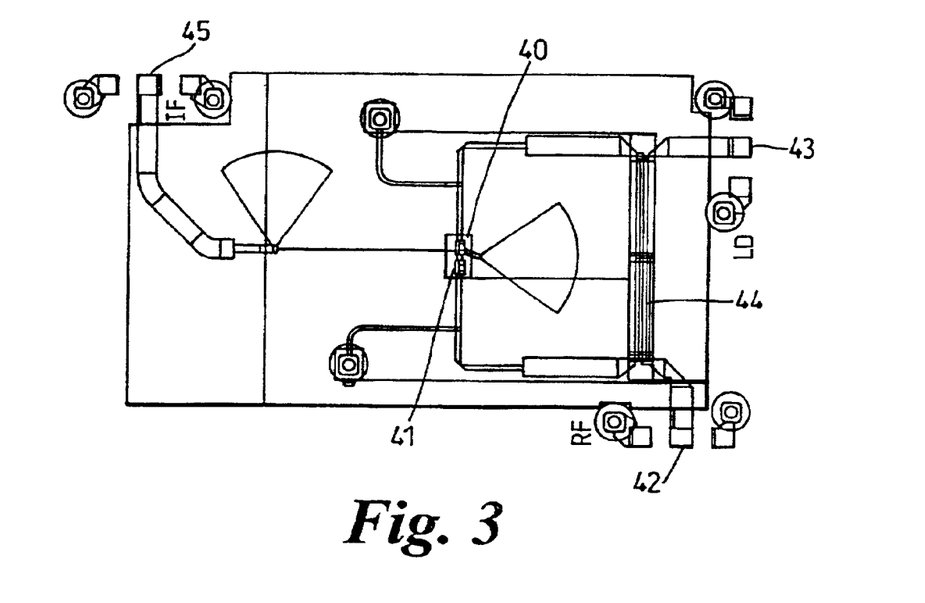
FIG. 3 shows the layout of the mixer of FIG. 1.

The layout of the mixer of the receiver MMIC is shown in FIG. 3. This is used to convert the frequency of the signal output from the LNA to a lower frequency mixer output signal. The mixer comprises two diodes 40,41. These are positioned in the mixer back-to-back. The signal from the LNA is fed into the mixer via a port 42, and a reference signal is fed into the mixer from the doubler/buffer amplifier MMIC via a port 43. The mixer is a 90° balanced mixer. The reference signal and the signal from the LNA output are split with a 90° phase difference by a Lange coupler 44. One portion of each of the reference signal and the LNA signal is fed to diode 40, and the other portions of these signals are fed to diode 41 which has its orientation reversed. Each diode mixes the reference signals and the LNA signals and produces an IF output signal, which output signals are combined in phase and fed to an output port 45 of the mixer. The output IF signal has a frequency equal to the difference in frequency of the signal from the LNA and the frequency of the reference signal. If the frequency of the signal from the LNA is 35 GHz and the frequency of the reference signal is 30 GHz, then the frequency of the IF signal output from the mixer will be 50 Hz.

This 90° balanced mixer topology provides very good input and output port impedance matches, giving the mixer input ports a broadband 50 Ω impedance. The mixer preferably has a conversion loss of less than 10 dB, LNA and reference signal input port return losses of greater than 15 dB and LO-RF isolation (i.e. isolation of the LO or reference signal from the signal from the LNA) of greater than 6 dB. The LO-F isolation (i.e. the amount of the reference signal seen in the (ID) output signal of the mixer) is greater than 15 dB.

Figure 4:
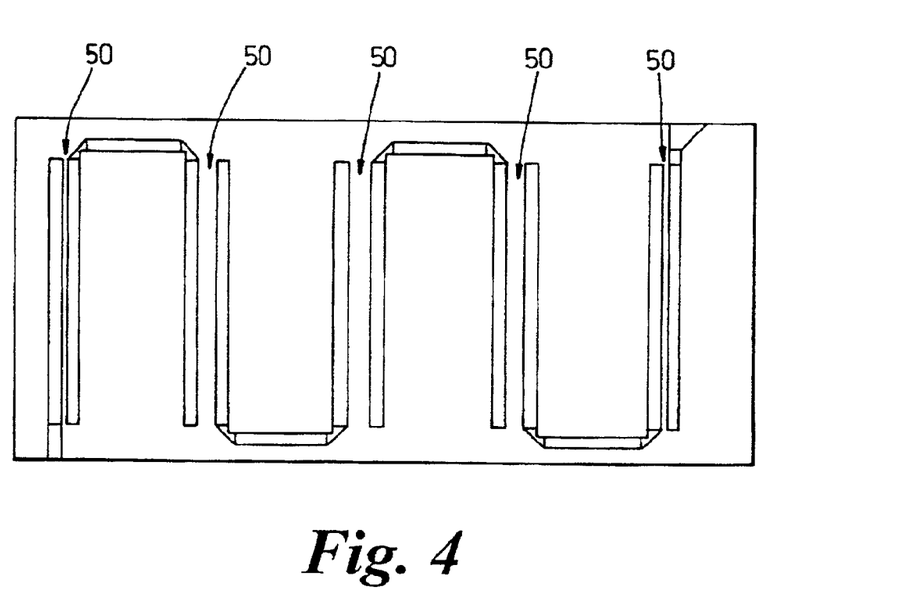
FIG. 4 shows the layout of the filter of FIG. 1.

Prior to being fed to the mixer, the output signal from the LNA is fed through a filter. The layout of the filter is shown in FIG. 4. This comprises a distributed transmission line design. To reduce MMIC area the filter is folded into a serpentine layout. The filter comprises five elements 50, which are quarter-wave coupled.

The passband of the filter is such that it suppresses a lower sideband. The passband of the filter is 35 to 40 GHz. This will suppress a lower sideband of 25 GHz, allowing only the 35 GHz sideband to be output from the filler. The filter produces a stopband attenuation of 49 dB at 25 GHz. The passband insertion loss of this filter is in the region of 2.3 dB from 35 to 40 GHz, and the port impedance matches are better than 15 dB.

Figure 5:
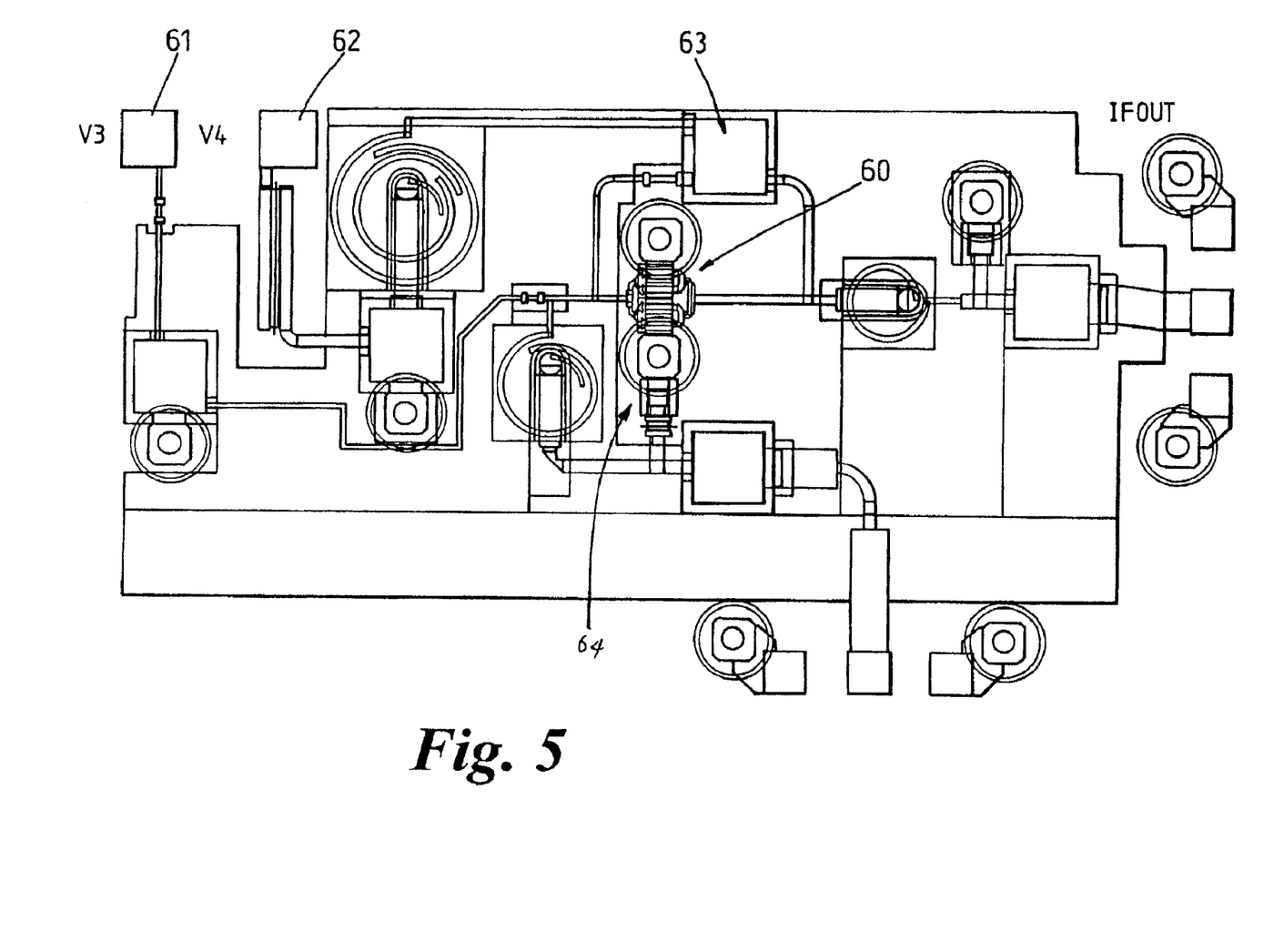
FIG. 5 shows the layout of the intermediate frequency amplifier of FIG. 1.

The layout of the IF amplifier is shown in FIG. 5. This receives the IF output signal from the mixer and amplifies it producing an IF output signal which is output from the receiver MMIC. The IF amplifier comprises a single transistor stage 60, and has a gain of greater than 9 dB. A 400 μm gate width transistor 60 capable of delivering 15 dBm of output power is used for this amplifier. This avoids the IF amplifier compressing before the LNA. The transistor is connected to a gate bias 61 and a drain bias 62. A parallel resistor-inductor-capacitor feedback network 63 is applied between the gate and drain bias terminals of the transistor. This helps to reduce the sensitivity of the IF amplifier to process variations. The IF amplifier input presents a 50 Ω impedance to the mixer at mm wavelengths as well as at IF frequencies. This helps to ensure correct mixer operation.

An RC network 64 is provided on the input to the IF amplifier. This is designed to ensure that an input impedance of 50 ohms is presented to the mixer output over a frequency range of DC to 50 GHz. This helps to provide a good termination at the LO and RF frequencies in the mixer to ensure low RF and LO breakthrough and thus maintain good RF-IF and LO-IF isolation.

Figure 6:
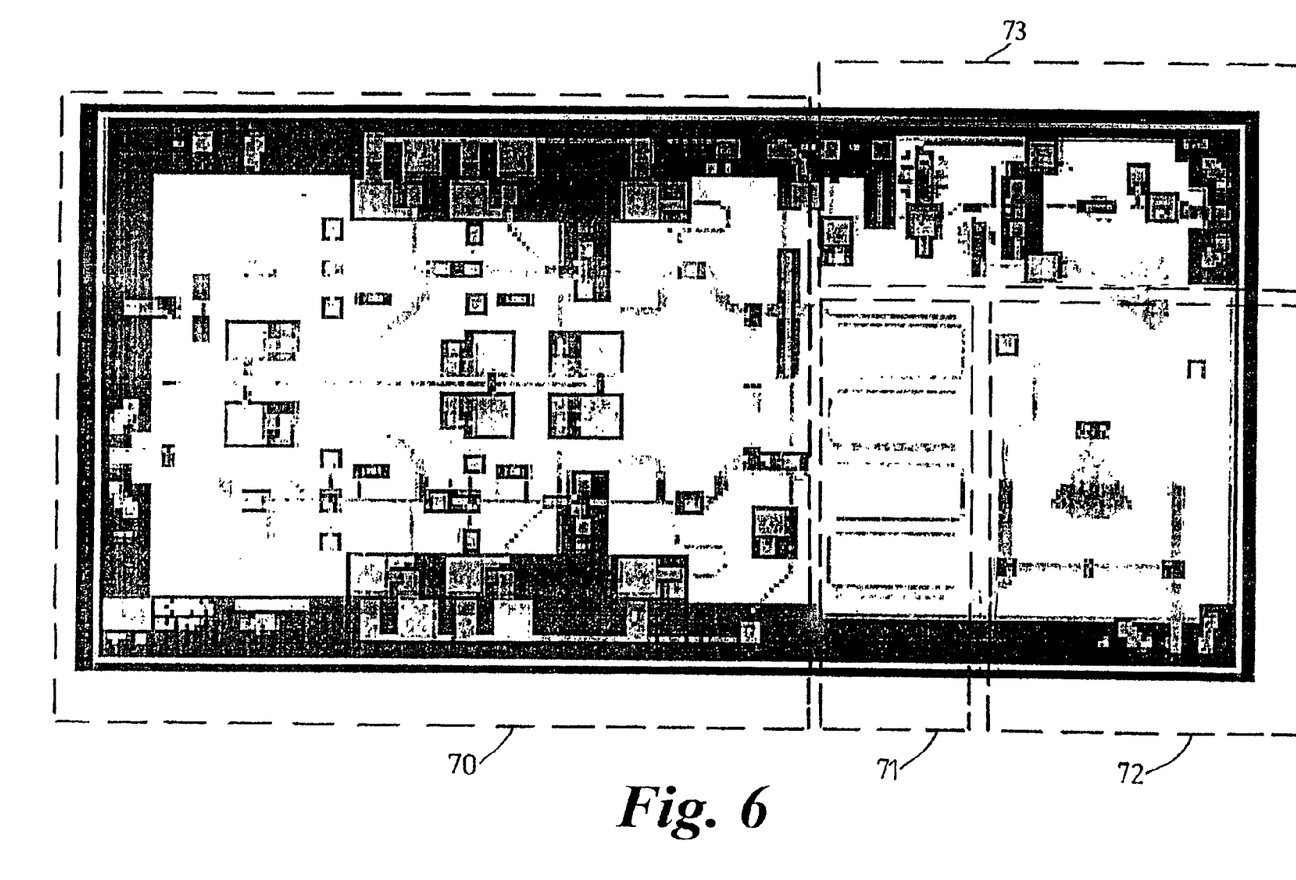
FIG. 6 shows the overall layout of the receiver MMIC of FIG. 1.
Figure 7:
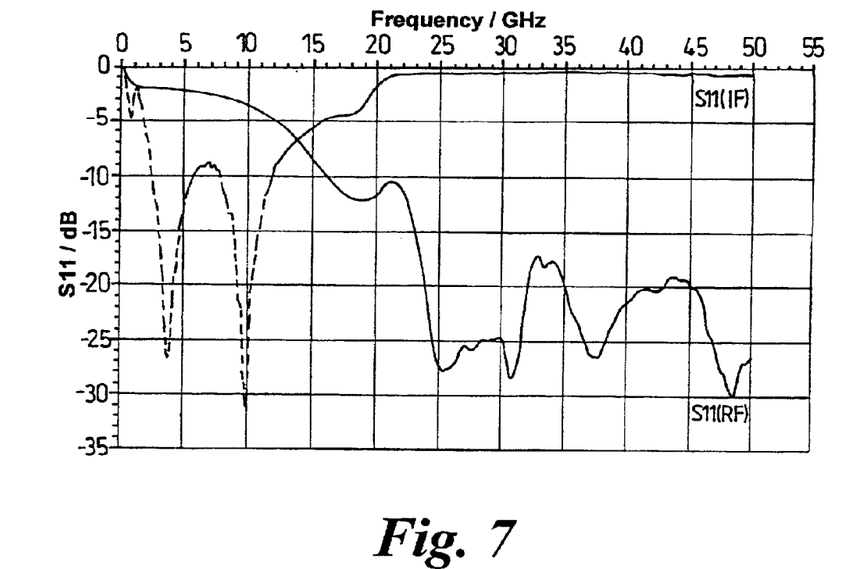
FIGS. 7 and 8 show radio frequency on wafer (RFOW) measurements of the receiver MMIC.
Figure 8:
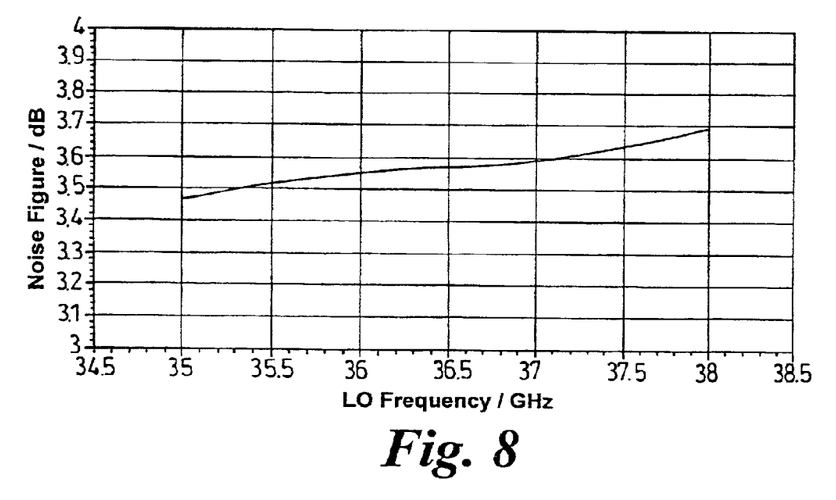

FIG. 6 shows the overall layout of the receiver MMIC showing the LNA 70, the filter 71, the mixer 72 and the IF amplifier 73. The MMIC has a size of 5.5 mm×2.64 mm. Radio frequency on wafer (RFOW) measurements of the receiver MMIC are shown in FIGS. 7 and 8. With a 32 GHz, 11 dBm reference signal and an IF output signal of 5 GHz the receiver MMIC exhibits 25 dB conversion gain, approximately 40 dB image rejection, 3.5 dB noise figure and PldB of 14 dBm. The receiver MMIC is capable of receiving electromagnetic wave signals having frequencies in the range 35 to 40 GHz or greater than this.

Figure 9:
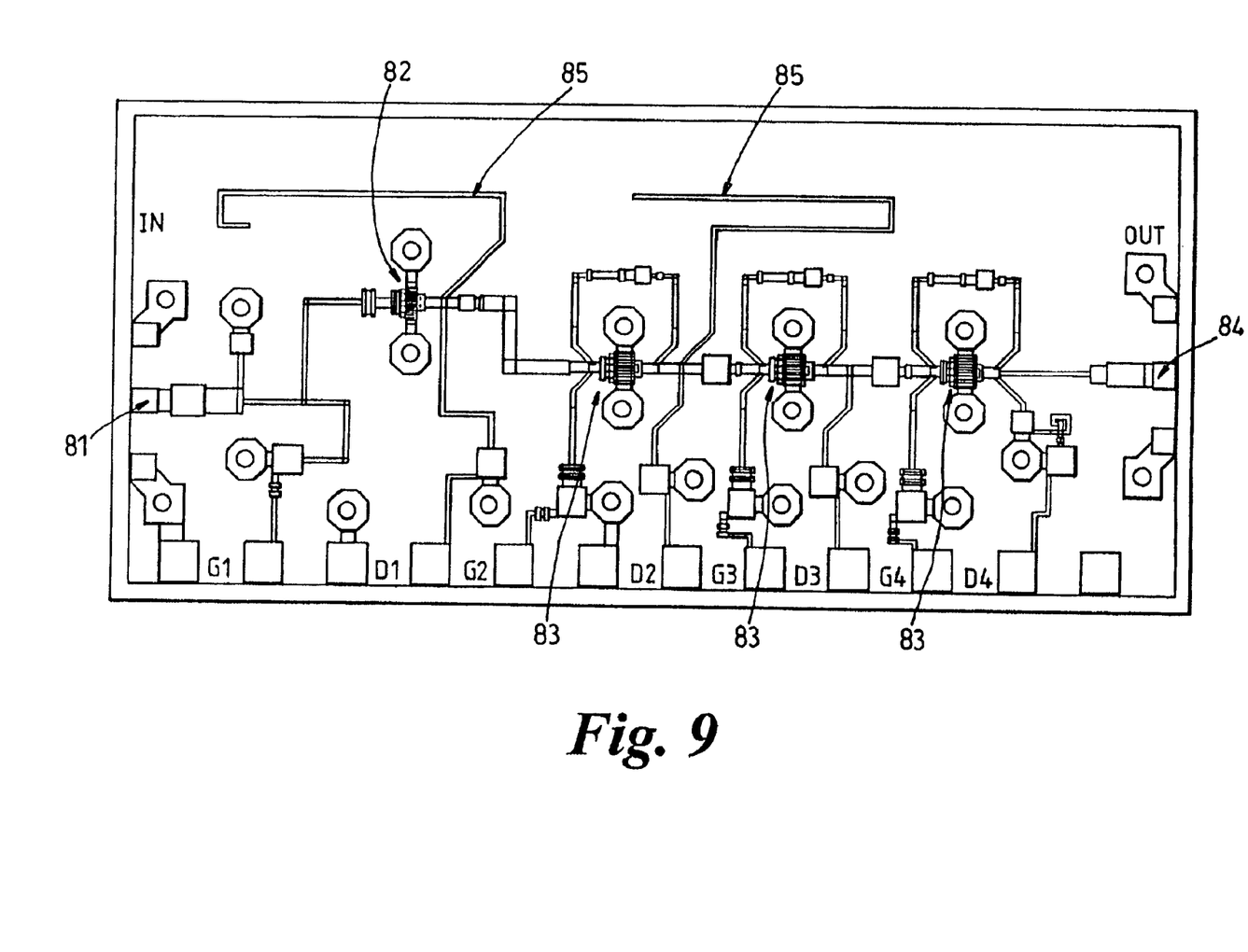
FIG. 9 shows the layout of the doubler/buffer amplifier MMIC of FIG. 1.

The layout of the doubler/buffer amplifier MMIC is shown in FIG. 9. This is placed between the LO and the mixer. It receives the reference signal produced by the LO via input port 81, and doubles the frequency of ds signal using a doubling component 82. The signal from this is then fed to a series of amplification stages 83 which produce a new reference signal which is output from the MMIC via output port 84. The doubler/buffer amplifier stages use a pinched-off 4×30 μm device operating as a half wave rectifier, and are matched to enhance and extract the second harmonic of the signal from the LO. Three stages of amplification are used to provide 13 dB of amplification and provide 30 to 40 dB of rejection of the LO signal. The doubler/buffer amplifier MMIC also comprises a filter component comprising two quarter wavelength open circuit stubs 85. These allow only the doubled frequency signal to be output from the MMIC, and suppress output of the signal received from the LO. The doubler/buffer amplifier MMIC layout has an area of approximately 4.7 mm².

Figure 10:
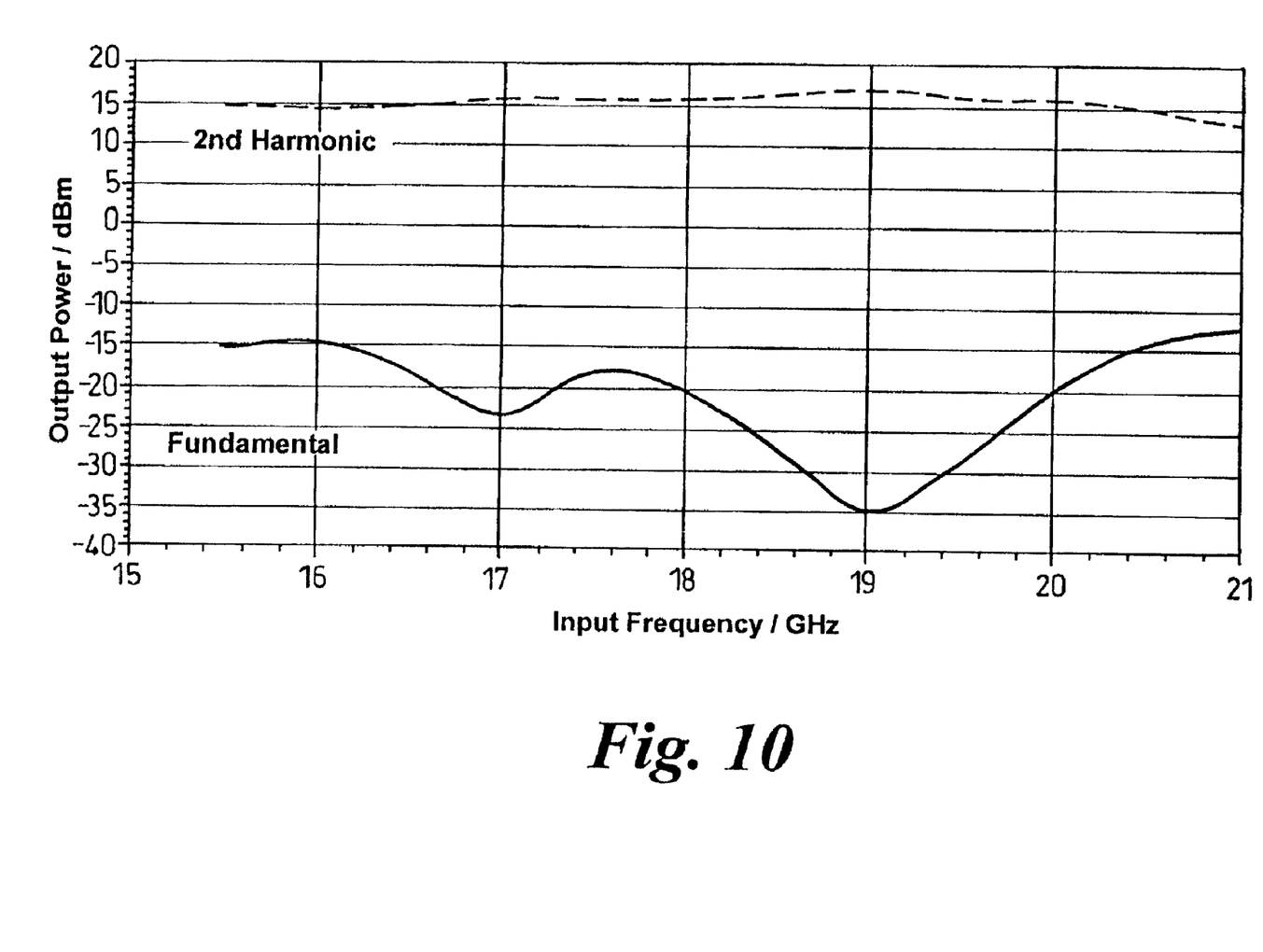
FIG. 10 shows the output power of the doubler/buffer amplifier as a function of input frequency.

Measured RFOW results from the doubler MMIC are shown in FIG. 10. For an input power of +1 dBm, ≧11 dBm output power was obtained over the 32 to 40 GHz frequency range. By increasing the input power to +6 dBm, typically 15 to 16 dBm of output power was obtained, more than enough to drive the mixer. Rejection of the LO signal was measured better than 28 dB over the same band.

Figure 11:
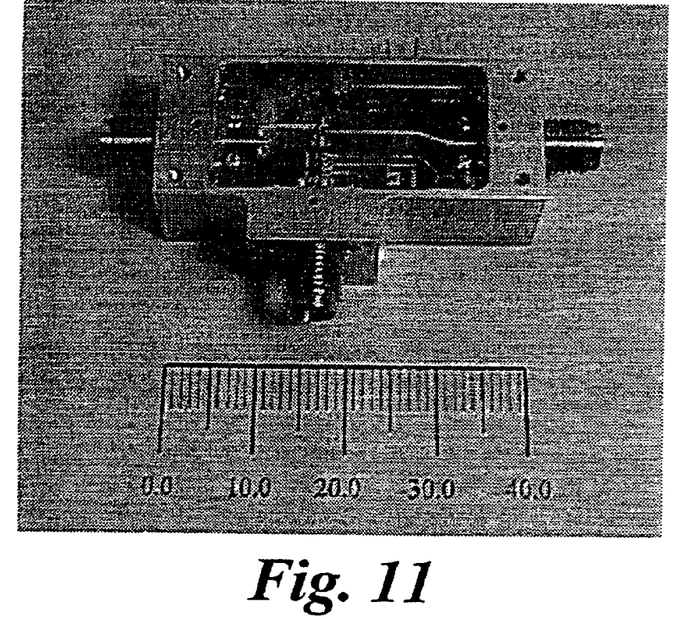
FIG. 11 is a photograph of a receiver front end package according to the second aspect of the invention.

A photograph of a receiver front end package is shown in FIG. 11. This comprises a receiver front end and power supply components for the receiver front end. The receiver package is double sided allowing isolation of the electromagnetic wave receiver front end and the power supply components into separate enclosures. Connections are made between the receiver front end and the power supply components using glass bead feedthroughs in the package floor. The MMICs of the receiver front end are placed on a receiver front end circuit board, which has a 125 µm RT Duroid 5880 substrate. The MMICs are attached onto brass backing in milled pockets in the Duroid substrate.

The noise figure of the receiver front end package is in the range 5.0 to 6.0 dB. The package measures in the region of 40 mm×27 mm×15 mm (i.e. in the region of 9 cm$^2$) or less than this. The power supply components comprise DC biasing circuits on a circuit board. These contain bias sequencing and voltage regulation for all of the bias lines of the receiver front end. This allows easier implementation of the receiver front end package as all bias voltages can be derived from only two DC supplies. A sequencing circuit is included to prohibit connection of the drain supplies for the receiver front end until the gate supplies have been established. The DC circuit board are implemented on 250 µm Alumina using standard thin film circuit techniques.

The connectors of the receiver front end package are co-axial Anritsu K-connectors, connected to the receiver front end using an airline launch technique. The technique allows easy insertion and removal of the receiver front end circuit board, and provides a better than 20 dB impedance match of the connectors with the receiver front end. The receiver front end circuit board is connected to the coaxial connectors by 250 µm gold tape bonds. These are kept as short as possible to minimise any parasitic inductance and maintain a good impedance match. The receiver front end package exhibits a conversion gain in the region of or greater than 24 dB, image rejection in the region of or greater than 40 dB and a noise figure in the region of or less than 5.5 dB.

Figure 12:
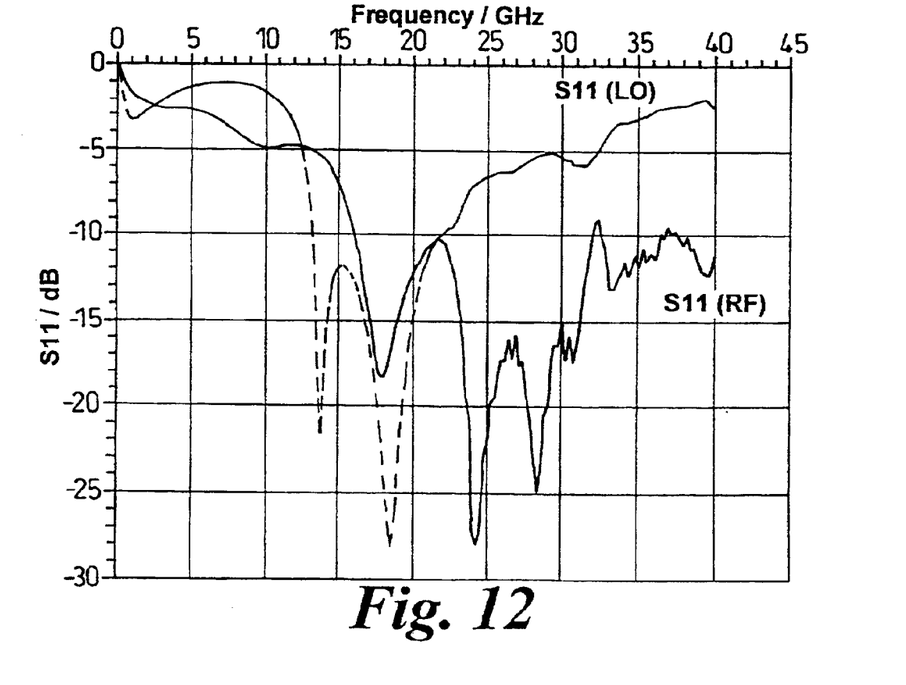
FIG. 12 shows RF, LO and IF port matches of the receiver front end package of FIG. 11.
Figure 13:
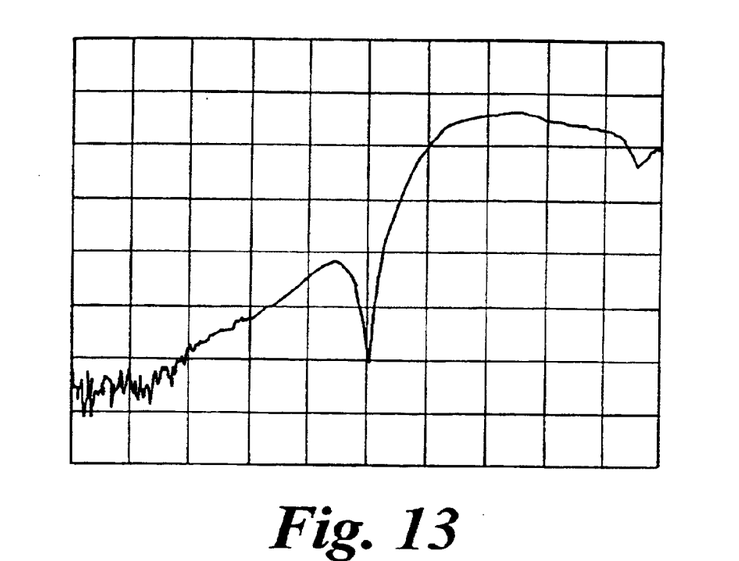
FIG. 13 shows the gain conversion and the image rejection of the receiver front end package of FIG. 11.
Figure 14:
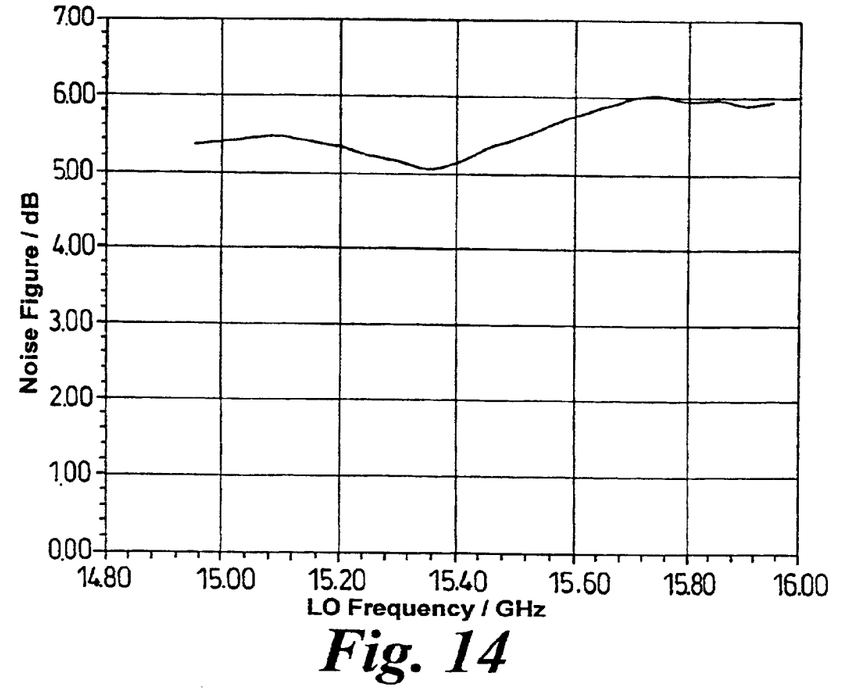
FIG. 14 shows the noise figure measurements of the receiver front end package of FIG. 11 as a function of the LO frequency.

When the receiver front end package is used to downconvert a 36.9 GHz RF input signal to a 6 GHz 1F output signal, an LO input of 15.45 GHz, doubled to 30.9 GHz, was required. This meant that the doubler/buffer amplifier MMIC was being operated at the lower limit of its bandwidth and therefore had to be supplied with 8 dBm to provide enough output power to drive the mixer. FIG. 12 shows RF (LNA signal, LO (reference signal) and IF port matches of the package to be better than 10 dB. Small signal gain is shown in FIG. 13 to be greater than 24 dB over an IF range of 2.5 to 8.5 GHz. Image rejection at 6 GHz IF was measured at 43.4 dB. Noise figure measurements were carried out on the receiver front end package and are shown in FIG. 14 at a fixed IF of 6 GHz with the LO swept from 35.9 to 37.9 GHz. It can be seen that the noise figure of the complete package is typically 5.0 to 6.0 dB (±0.5 dB uncertainty in the measurement).

What is claimed is:

1. A receiver front end for receiving electromagnetic wave signals having frequencies in the range of substantially 35 GHz to substantially 40 GHz, and having a gain of substantially 24 dB or above and a noise figure of substantially 4 dB or below, said receiver front end comprising at least one multifunction monolithic microwave integrated circuit (MMIC), said MMIC having a noise figure of substantially 4 dB or below over an output signal frequency range of substantially 1 to 10 GHz.

2. A receiver front end for receiving electromagnetic wave signals having frequencies in the range of substantially 35 GHz to substantially 40 GHz, a gain of substantially 24 dB or above, and a noise figure of substantially 4 dB or below, said front end comprising:

(a) a receiver MMIC comprising a low noise amplifier (LNA) with a noise figure less than 4 dB and a mixer for converting the frequency of a signal output from the LNA to a lower frequency mixer output signal, and (b) a doubler/buffer amplifier MMIC, wherein (i) said LNA is a balanced amplifier having separate amplification sections;

(ii) each electromagnetic signal received by said LNA is split into two substantially symmetric signals, each of which is fed into said separate amplification sections; and (iii) said mixer comprises two diodes, the signal from said LNA is fed into said diodes along with a reference signal and said diodes are adapted to multiply the signal from said LNA and said reference signal and provide an output signal having a frequency equal to the difference in frequency of the signal from said LNA and the frequency of said reference signal.

3. A receiver front end according to claim 2 wherein said mixer is a 90° balanced mixer.

4. A receiver front end for receiving electromagnetic wave signals having frequencies in the range of substantially 35 GHz to substantially 40 GHz, a gain of substantially 24 dB or above, and a noise figure of substantially 4 dB or below, said front end comprising:

(a) a receiver MMIC comprising a low noise amplifier (LNA) with a noise figure less than 4 dB and a mixer for converting the frequency of a signal output from the LNA to a lower frequency mixer output signal; and (b) a doubler/buffer amplifier MMIC, wherein (i) said LNA is a balanced amplifier having separate amplification sections;

(ii) each electromagnetic signal received by said LNA is split into two substantially symmetric signals, each of which is fed into said separate amplification sections; and (iii) wherein said receiver MMIC comprises an IF amplifier for receiving and amplifying an IF output signal from said mixer and producing an IF output signal which is output from said receiver MMIC, and wherein said amplifier comprises a single transistor stage having gate and drain terminals, and in which a parallel resistor-inductor-capacitor feedback network is applied between said gate and drain terminals of said transistor.

5. A receiver front end package comprising:

(i) an electromagnetic wave receiver front end for receiving electromagnetic wave signals having frequencies in the range of substantially 35 GHz to substantially 40 GHz, and having a gain of substantially 24 dB or above and a noise figure of substantially 4 dB or below, said receiver front end comprising at least one multifunction monolithic microwave integrated circuit (MMIC);

(ii) power supply components for said receiver front end; and (iii) connectors for said receiver and said power supply components, wherein said package is double sided with separate enclosures and provides isolation of said electromagnetic wave receiver front end and said power supply components into the separate enclosures, and in which connections are made between said receiver front end and said power supply components using glass bead feedthroughs in said package.

6. A receiver front end package comprising:

(i) an electromagnetic wave receiver front end for receiving electromagnetic wave signals having frequencies in the range of substantially 35 GHz to substantially 40 GHz, and having a gain of substantially 24 dB or above and a noise figure of substantially 4 dB or below, and comprising at least one multifunction monolithic microwave integrated circuit (MMIC);

(ii) power supply components for said receiver front end; and (iii) connectors for said receiver and said power supply components, wherein said power supply components comprise DC biasing circuits on a circuit board, said biasing circuits containing bias sequencing and voltage regulation for all of the bias lines of said receiver front end, and wherein said connectors are connected to the receiver front end using an airline launch technique with a better than 20 dB impedance match of said connectors with said receiver front end.

7. A receiver front end comprising:

i) a first amplifier adapted to amplify a received signal and provide an amplified signal;

ii) a filter adapted to filter said amplified signal and provide a filtered signal;

iii) a mixer adapted to take a reference signal and said filtered signal and mix them such that said mixer provides an output in a frequency range different from that of said filtered signal, so as to provide a mixed signal;

iv) a second amplifier adapted to amplify said mixed signal; and wherein the first amplifier comprises:

a) a first Lange coupler adapted to split the signal in first and second signals such that said first and second signals have substantially 90° phase difference;

b) a first amplification section adapted to amplify said first signal and a second amplification section adapted to amplify said second signal, said first and second amplification sections having balanced topographies, each section having first, second and third transistors and a gate and a drain bias for said transistors, said gate and drain biases being common to all the transistors; shunt resistors associated with the gate of each transistor; a series resistor-inductor-capacitor network in parallel with said section; and parallel feedback being provided across said third transistor; and c) said first and second stages having respective outputs, and a further Lange coupler being provided so as to combine said outputs of said amplification sections.

8. A receiver front end comprising:

i) a first amplifier adapted to amplify a received signal and provide an amplified signal;

ii) a filter adapted to filter said amplified signal and provide a filtered signal;

iii) a mixer adapted to take a reference signal and said filtered signal and mix them such that said mixer provides an output in a frequency range different from that of said filtered signal, so as to provide a mixed signal;

iv) a second amplifier adapted to amplify said mixed signal; and wherein said mixer comprises:

a) a Lange coupler arranged such that both said reference signal and said filtered signal are added together and then separated into first and second signals with a phase difference of substantially 90°; and b) first and second diodes, each supplied with one of said phase separated first and second signals, said first and second diodes being arranged such that said first diode is in one orientation with respect to said first input signal and said second diode is in the opposite orientation with respect to said second signal;

and arranged such that a combined output signal of said first and second diodes has a frequency substantially equal to the difference between said reference and filtered signals.

9. A receiver front end comprising:

i) a first amplifier adapted to amplify a received signal and provide an amplified signal;

ii) a filter adapted to filter said amplified signal and provide a filtered signal;

iii) a mixer adapted to take a reference signal and said filtered signal and mix them such that said mixer provides an output in a frequency range different from that of said filtered signal, so as to provide a mixed signal;

iv) a second amplifier adapted to amplify said mixed signal; and wherein said second amplifier has an output impedance and comprises a single transistor having a gate and a drain bias, a resistor-inductor-capacitor network provided between gate and drain terminals of said transistor and a resistor-capacitor network adapted to match said input impedance of the second amplifier to that required by said mixer for proper operation thereof.

10. A receiver front end comprising:

i) a first amplifier adapted to amplify a received signal and provide an amplified signal;

ii) a filter adapted to filter said amplified signal and provide a filtered signal;

iii) a mixer adapted to take a reference signal and said filtered signal and mix them such that said mixer provides an output in a frequency range different from that of said filtered signal, so as to provide a mixed signal;

iv) a second amplifier adapted to amplify said mixed signal; and wherein the first amplifier comprises:

a) a first Lange coupler adapted to split the signal in first and second signals such that said first and second signals have substantially 90° phase difference;

b) a first amplification section adapted to amplify said first signal and a second amplification section adapted to amplify said second signal, said first and second amplification sections having balanced topographies, each section having first, second and third transistors and a gate and a drain bias for said transistors, said gate and drain biases being common to all the transistors; shunt resistors associated with the gate of each transistor; a series resistor-inductor-capacitor network in parallel with said section, and parallel feedback being provided across said third transistor; and c) said first and second stages having respective outputs, and a further Lange coupler being provided so as to combine said outputs of said amplification sections; and wherein said mixer comprises:

a) a Lange coupler arranged such that both said reference signal and said filtered signal are added together and then separated into first and second signals with a phase difference of substantially 90°; and b) first and second diodes, each supplied with one of said phase separated first and second signals, said first and second diodes being arranged such that said first diode is in one orientation with respect to said first input signal and said second diode is in the opposite orientation with respect to said second signal;

and arranged such that a combined output signal of said first and second diodes has a frequency substantially equal to the difference between said reference and filtered signals; and wherein said filter is a distributed transmission line filter, arranged in a serpentine fashion, containing quarter wave coupled elements, said filter being adapted to suppress a sideband of the output of said first amplifier;

wherein said second amplifier has an output impedance and comprises a single transistor having a gate and a drain bias, a resistor-inductor-capacitor network provided between gate and drain terminals of said transistor and a resistor-capacitor network adapted to match said input impedance of the second amplifier to that required by said mixer for proper thereof; and wherein said reference signal is generated by means of a local oscillator, the output of which is sued to supply a frequency doubler, the output of said doubler being passed through an amplifier before being used as said reference signal.

* * * * *